US011710771B2

(12) United States Patent
Derrickson et al.

(10) Patent No.: US 11,710,771 B2
(45) Date of Patent: Jul. 25, 2023

(54) NON-SELF-ALIGNED LATERAL BIPOLAR JUNCTION TRANSISTORS (71) Applicant: GlobalFoundries U.S. Inc., Malta, NY (US)

(72) Inventors: Alexander Derrickson, Saratoga Springs, NY (US); Judson R. Holt, Ballston Lake, NY (US); Haiting Wang, Clifton Park, NY (US); Jagar Singh, Clifton Park, NY (US); Vibhor Jain, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 64 days.

(21) Appl. No.: 17/524,043

(22) Filed: Nov. 11, 2021

(65) Prior Publication Data
US 2023/0069207 A1 Mar. 2, 2023

Related U.S. Application Data (60) Provisional application No. 63/239,525, filed on Sep. 1, 2021.

(51) Int. Cl.
*H01L 29/10* (2006.01)
*H01L 29/08* (2006.01)
*H01L 29/66* (2006.01)
*H01L 29/735* (2006.01)
*H01L 29/737* (2006.01)

(52) U.S. Cl.
CPC ...... *H01L 29/1008* (2013.01); *H01L 29/0808* (2013.01); *H01L 29/0817* (2013.01); *H01L 29/0821* (2013.01); *H01L 29/6625* (2013.01); *H01L 29/6656* (2013.01); *H01L 29/66242* (2013.01); *H01L 29/66553* (2013.01); *H01L 29/735* (2013.01); *H01L 29/737* (2013.01)

(58) Field of Classification Search
CPC ............. H01L 29/1008; H01L 29/0808; H01L 29/0817; H01L 29/0821; H01L 29/66242; H01L 29/6625; H01L 29/66553; H01L 29/6656; H01L 29/735; H01L 29/737
See application file for complete search history.

(56) References Cited

U.S. PATENT DOCUMENTS

| 6,940,149 | B1 | 9/2005 | Divakaruni et al. |
| 6,949,764 | B2 | 9/2005 | Ning |
| 8,288,758 | B2 | 10/2012 | Ning et al. |
| 8,420,493 | B2 | 4/2013 | Ning et al. |
| 8,586,441 | B1 | 11/2013 | Cai et al. |
| 9,252,233 | B2 | 2/2016 | Hsiao et al. |

(Continued)

*Primary Examiner* — Syed I Gheyas
(74) *Attorney, Agent, or Firm* — Thompson Hine LLP; Francois Pagette (57) ABSTRACT

Structures for a bipolar junction transistor and methods of forming a structure for a bipolar junction transistor. The structure includes an emitter having a raised portion, a collector having a raised portion, and a base having a base layer and an extrinsic base layer stacked with the base layer. The base layer and the extrinsic base layer are positioned in a lateral direction between the raised portion of the emitter and the raised portion of the collector, the base layer has a first width in the lateral direction, the extrinsic base layer has a second width in the lateral direction, and the second width is greater than the first width.

20 Claims, 6 Drawing Sheets (56) References Cited

U.S. PATENT DOCUMENTS

| | | | |
|---|---|---|---|
| 10,825,921 B2 | 11/2020 | Balakrishnan et al. | |
| 2001/0054746 A1* | 12/2001 | Yamada | H01L 29/1008 257/565 |
| 2019/0355831 A1* | 11/2019 | Hashemi | H01L 29/42304 |

* cited by examiner

NON-SELF-ALIGNED LATERAL BIPOLAR JUNCTION TRANSISTORS

CROSS-REFERENCE TO RELATED APPLICATIONS

This application claims the benefit of U.S. Provisional Application No. 63/239,525, filed Sep. 1, 2021, which is hereby incorporated by reference herein in its entirety.

BACKGROUND

The invention relates generally to semiconductor devices and integrated circuit fabrication and, in particular, to structures for a bipolar junction transistor and methods of forming a structure for a bipolar junction transistor.

A bipolar junction transistor is a multi-terminal electronic device with a structure that includes an emitter, a collector, and an intrinsic base arranged between the emitter and collector. In an NPN bipolar junction transistor, the emitter and collector are comprised of n-type semiconductor material, and the intrinsic base is comprised of p-type semiconductor material. In a PNP bipolar junction transistor, the emitter and collector are comprised of p-type semiconductor material, and the intrinsic base is comprised of n-type semiconductor material. During operation, the base-emitter junction is forward biased, the base-collector junction is reverse biased, and the collector-emitter current may be controlled by varying the base-emitter voltage.

A heterojunction bipolar transistor is a variant of a bipolar junction transistor in which the semiconductor materials of the terminals have different energy bandgaps, which creates heterojunctions. For example, the collector and/or emitter of a heterojunction bipolar transistor may be comprised of silicon, and the intrinsic base of a heterojunction bipolar transistor may be comprised of silicon-germanium, which is characterized by a narrower band gap than silicon.

Improved structures for a bipolar junction transistor and methods of forming a structure for a bipolar junction transistor are needed.

SUMMARY

In an embodiment of the invention, a structure is provided for a lateral bipolar junction transistor. The structure includes an emitter having a raised portion, a collector having a raised portion, and a base having a base layer and an extrinsic base layer stacked with the base layer. The base layer and the extrinsic base layer are positioned in a lateral direction between the raised portion of the emitter and the raised portion of the collector, the base layer has a first width in the lateral direction, the extrinsic base layer has a second width in the lateral direction, and the second width is greater than the first width.

In an embodiment of the invention, a method of forming a structure for a lateral bipolar junction transistor is provided. The method includes forming a raised portion of an emitter and a raised portion of a collector, and forming a base layer of a base. The base layer is positioned in a lateral direction between the raised portion of the emitter and the raised portion of the collector. The method further includes forming an extrinsic base layer of the base that is stacked with the base layer. The extrinsic base layer is positioned in the lateral direction between the raised portion of the emitter and the raised portion of the collector. The base layer has a first width in the lateral direction, the extrinsic base layer has a second width in the lateral direction, and the second width is greater than the first width.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
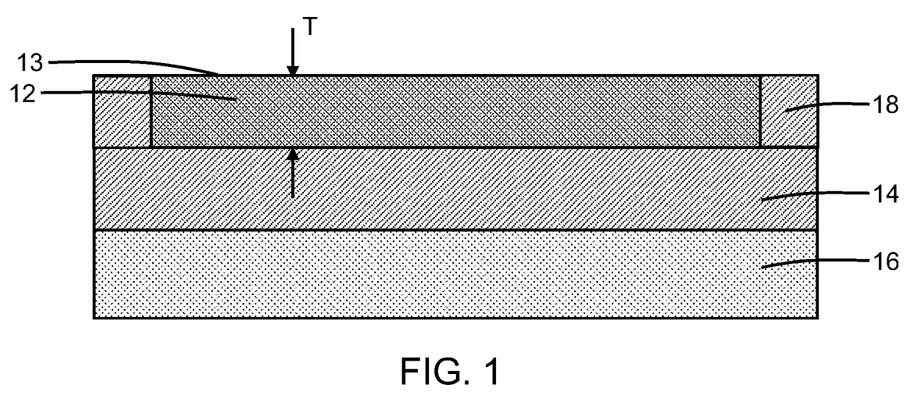
FIGS. 1-7 are cross-sectional views of a structure at successive fabrication stages of a processing method in accordance with embodiments of the invention.

With reference to FIG. 1 and in accordance with embodiments of the invention, a semiconductor-on-insulator substrate includes a device layer 12, a buried insulator layer 14, and a handle substrate 16. The device layer 12 is separated from the handle substrate 16 by the intervening buried insulator layer 14 and is considerably thinner than the handle substrate 16. The device layer 12 and the handle substrate 16 may be comprised of a semiconductor material, such as single-crystal silicon, the handle substrate 16 may be lightly doped to have, for example, p-type conductivity, and the buried insulator layer 14 may be comprised of a dielectric material, such as silicon dioxide, that electrically isolates the device layer 12 from the handle substrate 16. The buried insulator layer 14 has a lower surface in direct contact with the handle substrate 16 along an interface and an upper surface in direct contact with the device layer 12 along another interface. The device layer 12 has a thickness T that may be measured between its top surface 13 and the interface with the buried insulator layer 14. In an embodiment, the device layer 12 may have a thickness in a range of about 4 nanometers (nm) to about 10 nm, and the device layer 12 may be used to fabricate fully-depleted silicon-on-insulator (FDSOI) device structures.

In an alternative embodiment, the device layer 12 may be thickened to compensate for intrinsic base gouging (i.e., recess formation) during subsequent processing. In an embodiment, the device layer 12 may be doped (e.g., lightly-doped) by, for example, an ion implantation process introducing a p-type dopant (e.g., boron) to produce p-type conductivity.

Shallow trench isolation regions 18 are formed that extend fully through the device layer 12. The shallow trench isolation regions 18 may be formed by etching trenches that penetrate through the device layer 12 using a patterned hardmask, depositing a dielectric material, such as silicon dioxide, in the trenches, and planarizing with chemical-mechanical polishing. The shallow trench isolation regions 18 surround an active region of the device layer 12 in which a device structure (e.g., a lateral bipolar junction transistor) may be subsequently formed.

Figure 2:
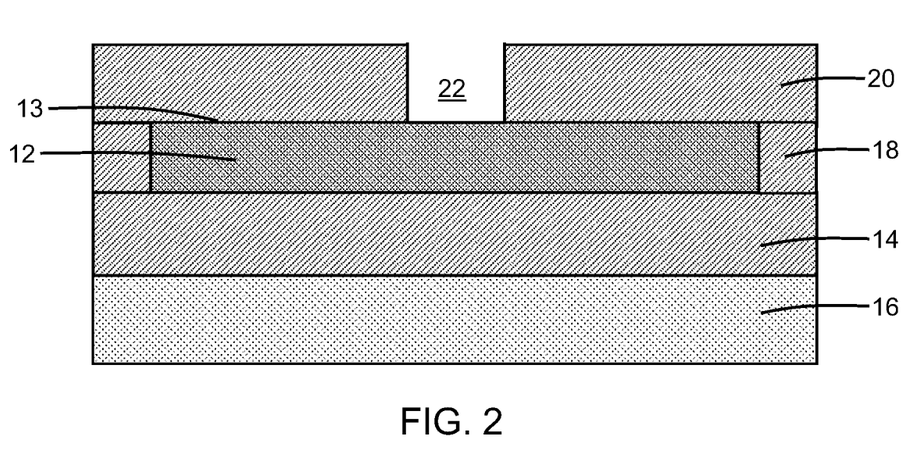

With reference to FIG. 2 in which like reference numerals refer to like features in FIG. 1 and at a subsequent fabrication stage, a dielectric layer 20 is formed on the device layer 12 in the active region of the device layer 12. In an embodiment, the dielectric layer 20 may contain silicon dioxide that is formed by a thermal oxidation process, which may also thicken the shallow trench isolation regions 18.

An opening 22 is patterned in the dielectric layer 20 using lithography and etching processes in which the etching process may be a reactive ion etching process. The opening 22 in the dielectric layer 20 extends to the device layer 12. In an embodiment, the opening 22 may have a width equal to about 50 nm. In an embodiment, the opening 22 may be centered in the active region.

Figure 3:
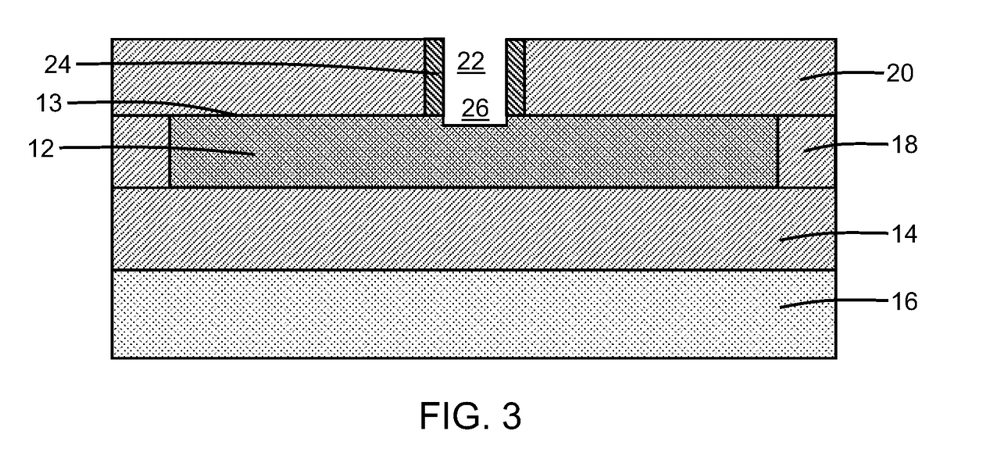

With reference to FIG. 3 in which like reference numerals refer to like features in FIG. 2 and at a subsequent fabrication stage, an inner spacer 24 may be formed that narrows the width of the opening 22. The inner spacer 24 may be comprised of, for example, silicon nitride deposited as a conformal layer and etched with an anisotropic etching process. In an embodiment, the opening 22 may have a narrowed width in a range of about 10 nm to about 20 nm.

A recess 26 may be formed as a gouge in the device layer 12 by an etching process. The recess 26 may have a width that is equal or substantially equal to the width of the opening 22 in the dielectric layer 20. The inner spacer 24 may self-align the etching process and may establish the width of the recess 26. The recess 26 penetrates partially through the device layer 12. In an embodiment, the depth of the recess 26 may be on the order of about 1 nm to about 2 nm.

In an alternative embodiment, the recess 26 may be omitted. In an alternative embodiment, the inner spacer 24 may be omitted such that the opening 22 in the dielectric layer 20 is not narrowed before forming the recess 26.

Figure 4:
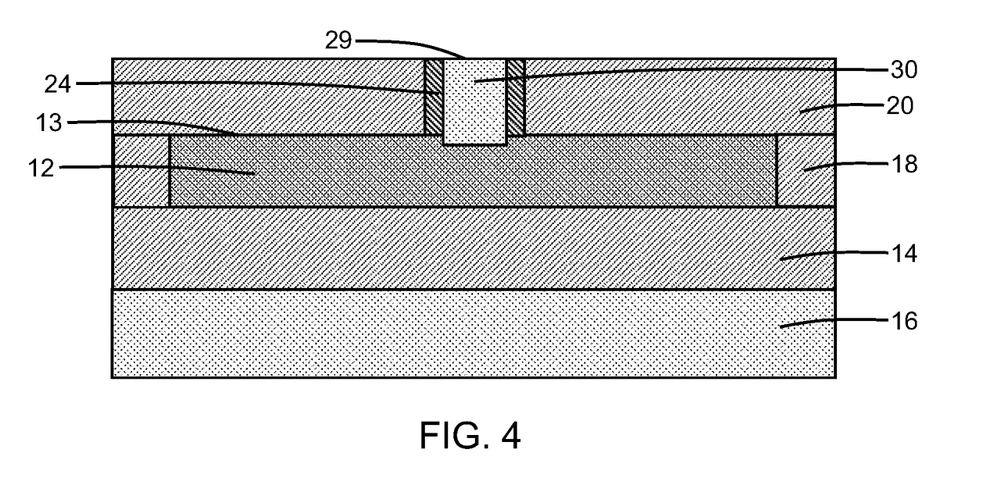

With reference to FIG. 4 in which like reference numerals refer to like features in FIG. 3 and at a subsequent fabrication stage, a base layer 30 is formed inside the opening 22 in the dielectric layer 20. A lower portion of the base layer 30 is located in the recess 26 and an upper portion of the base layer 30 is located inside the opening 22. The upper portion of the base layer 30 projects out of the recess 26. The upper portion of the base layer 30 has a top surface 29 that may be coplanar or substantially coplanar with a top surface of the inner spacer 24 and/or may be coplanar or substantially coplanar with a top surface of the dielectric layer 20.

The base layer 30 may be arranged in direct contact with the device layer 12 to define an interface. The base layer 30 may contain single-crystal semiconductor material that is epitaxially grown inside the opening 22. In that regard, the base layer 30 may be formed by the epitaxial growth of semiconductor material from the surfaces of the device layer 12 at the bottom and sides of the opening 22. The base layer 30 may be constrained during epitaxial growth by the inner spacer 24. In an embodiment, the semiconductor material of the base layer 30 may be comprised at least in part of silicon-germanium including silicon and germanium with the silicon content ranging from 95 atomic percent to 50 atomic percent and the germanium content ranging from 5 atomic percent to 50 atomic percent. The germanium content of the base layer 30 may be uniform, or the germanium content of the base layer 30 may have a graded profile and/or stepped profile across its thickness with portions that lack germanium. The base layer 30 may be in situ doped during epitaxial growth with a concentration of a dopant, such as a p-type dopant (e.g., boron) that provides p-type conductivity. In embodiment, the base layer 30 may be formed by a selective epitaxial growth process in which the semiconductor material does not form on the dielectric layer 20. In an embodiment, the base layer 30 may have a thickness of about 5 nm.

Figure 5:
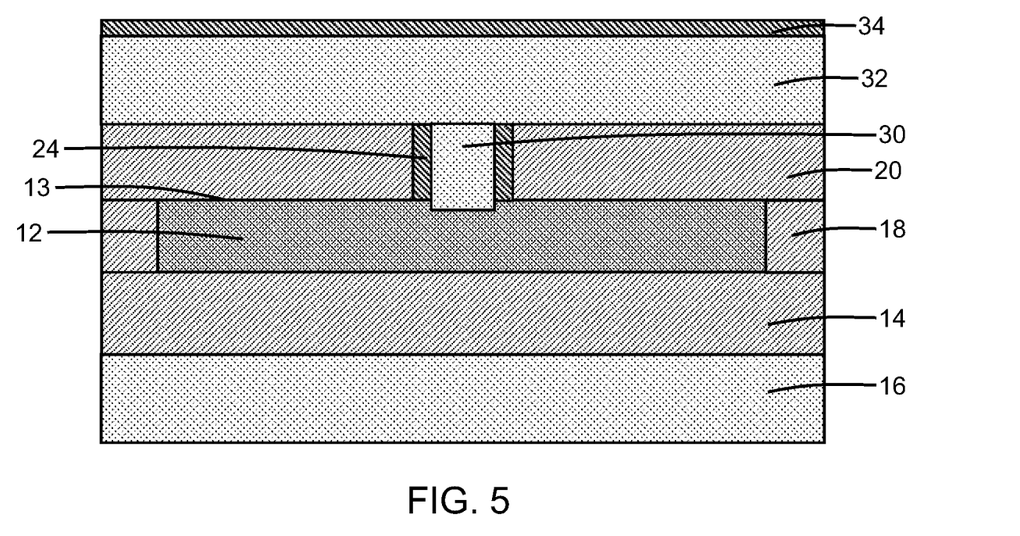

With reference to FIG. 5 in which like reference numerals refer to like features in FIG. 4 and at a subsequent fabrication stage, a semiconductor layer 32 and a cap layer 34 are formed over the dielectric layer 20 and base layer 30. In an embodiment, the semiconductor layer 32 may contain silicon formed by a non-selective epitaxial growth process and may be doped (e.g., heavily-doped) with a p-type dopant (e.g., boron). The cap layer 34 may contain a dielectric material, such as silicon nitride.

Figure 6:
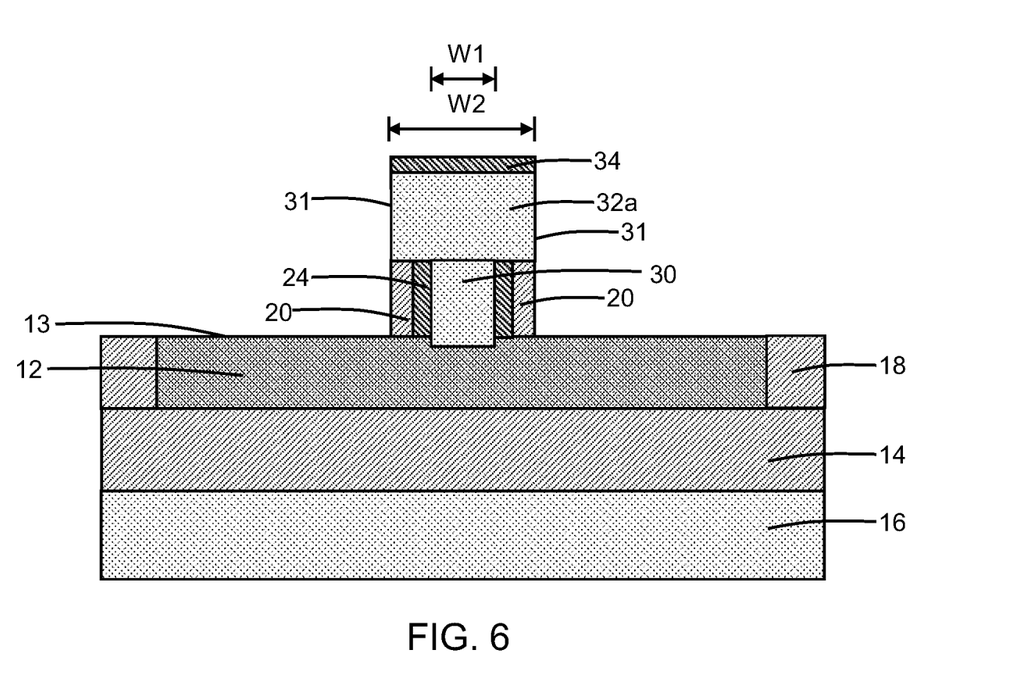

With reference to FIG. 6 in which like reference numerals refer to like features in FIG. 5 and at a subsequent fabrication stage, the cap layer 34 may be patterned with lithography and etching processes, and then an extrinsic base layer 32a may be formed by patterning the semiconductor layer 32 with an etching process (e.g., an ion etching process) using the patterned cap layer 34 as a hardmask. The extrinsic base layer 32a, which has side surfaces 31 and a width W2 between its side surfaces 31, is formed without self-alignment (i.e., non-self-aligned) relative to the base layer 30. The width W2 of the extrinsic base layer 32a is greater than a width W1 of the base layer 30. The extrinsic base layer 32a is stacked over the base layer 30. In an embodiment, the extrinsic base layer 32a may be centered relative to the base layer 30.

The dielectric layer 20 is subsequently patterned with, for example, an oxide etching process to open the top surface 13 of the device layer 12. Residual portions of the dielectric layer 20 may be preserved in the space between the device layer 12 and the extrinsic base layer 32a. The extrinsic base layer 32a may overlap at its opposite side surfaces 31 with the dielectric layer 20.

Figure 7:
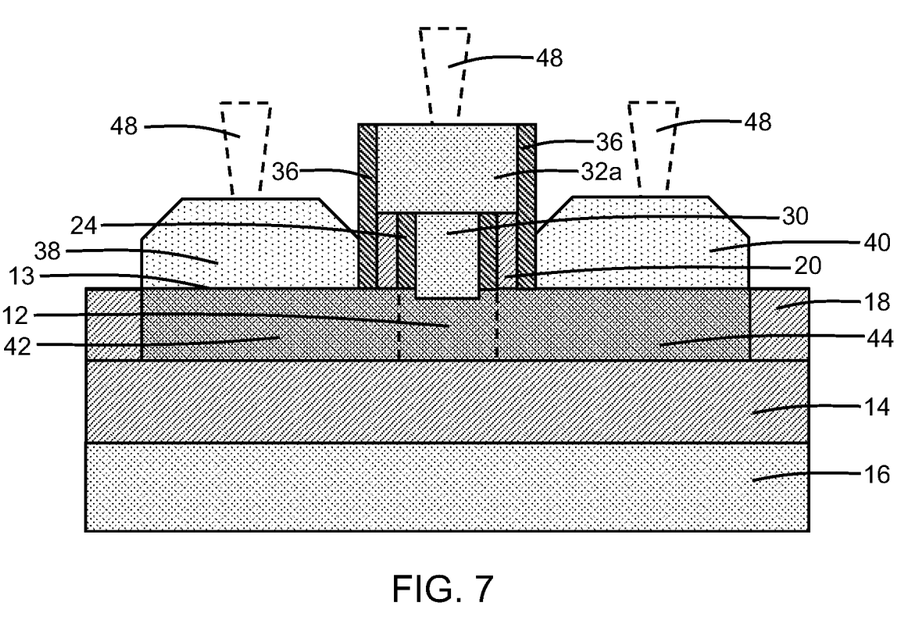

With reference to FIG. 7 in which like reference numerals refer to like features in FIG. 6 and at a subsequent fabrication stage, outer spacers 36 may be formed at the side surfaces 31 of the extrinsic base layer 32a and cap layer 34. The outer spacers 36 may be comprised of, for example, silicon nitride deposited as a conformal layer and etched with an anisotropic etching process. The outer spacers 36, the preserved portions of the dielectric layer 20, and the inner spacer 24 may define L-shaped composite spacers with multiple distinct sections.

Semiconductor layers 38, 40 are formed on the respective sections of the device layer 12 adjacent to the side surfaces 31 of the extrinsic base layer 32a. The base layer 30 and the extrinsic base layer 32a are positioned in a lateral direction between the semiconductor layer 38 and the semiconductor layer 40. The outer spacers 36 separate and electrically isolate the semiconductor layers 38, 40 from the side surfaces 31 of the extrinsic base layer 32a. The semiconductor layers 38, 40 may be formed by the epitaxial growth of semiconductor material (e.g., single-crystal silicon) from the top surface 13 of the device layer 12 over exposed surface areas between the shallow trench isolation regions 18 and the outer spacers 36. In an embodiment, the semiconductor material of the semiconductor layers 38, 40 may be doped (e.g., heavily doped) with a concentration of a dopant, such as an n-type dopant (e.g., phosphorus) that provides n-type conductivity.

A doped region 42 may be formed in a section of the device layer 12 by diffusion of dopant from the semiconductor layer 38 into the device layer 12. A doped region 44 may be formed in a section of the device layer 12 by diffusion of dopant from the semiconductor layer 40 into the device layer 12. Dopant may diffuse from the semiconductor layers 38, 40 into the device layer 12 and also diffuse laterally to form doped regions 42, 44 in the device layer 12. For example, an optional rapid thermal anneal may be utilized to cause the dopant diffusion. However, the diffusion is controlled such that a section of the device layer 12 beneath the base layer 30 does not receive the diffused dopant. The section of the device layer 12 beneath the base layer 30 separates the base layer 30 from the buried insulator layer 14. The semiconductor layer 38 and the doped region 42, the semiconductor layer 40 and the doped region 44, and the base layer 30 may define the terminals of a lateral bipolar junction transistor (e.g., a lateral heterojunction bipolar transistor). The semiconductor layers 38, 40 provide raised portions of the terminals that are located on the device layer 12, and the doped regions 42, 44 provide non-raised portions of the terminals that are located in the device layer 12. In an embodiment, the semiconductor layer 38 and the doped region 42 may provide a collector of a lateral bipolar junction transistor, the semiconductor layer 40 and the doped region 44 may provide an emitter of the lateral bipolar junction transistor, and the base layer 30 and the section of the device layer 12 beneath the base layer 30 provide an intrinsic base that is positioned in a lateral direction between the collector and emitter. In an alternative embodiment, the semiconductor layer 40 and the doped region 44 may provide a collector of a lateral bipolar junction transistor, the semiconductor layer 38 and the doped region 42 may provide an emitter of the lateral bipolar junction transistor, and the base layer 30 and the section of the device layer 12 beneath the base layer 30 provide an intrinsic base that is positioned in a lateral direction between the emitter and collector.

Middle-of-line (MOL) processing follows, which includes removal of the cap layer 34 from the extrinsic base layer 32a, formation of silicide (not shown) on the extrinsic base layer 32a and semiconductor layers 38, 40, and the formation of an interconnect structure that includes contacts 48 that are coupled by the silicide with the collector, base, and emitter of the lateral bipolar junction transistor.

The lateral bipolar junction transistor (e.g., a lateral heterojunction bipolar transistor) is characterized by a lateral arrangement of the collector, base, and emitter. The base layer 30 may include a lower portion that is positioned in a recess 26 defined as a gouge in the device layer 12 with the underlying portion of the device layer 12 separating the base layer 30 from the buried insulator layer 14. The extrinsic base layer 32a and base layer 30 have a T-shape with a wider extrinsic base layer 32a stacked over a narrower base layer 30. This stacked arrangement includes a narrow base width (e.g., 10 nm to 20 nm) for the base layer 30, which improves device performance, and a larger surface area on the extrinsic base layer 32a to facilitate the landing of a base contact 48. The outer spacers 36 separate and electrically isolate the semiconductor layers 38, 40 from the extrinsic base layer 32a. The width of the base layer 30 may be narrowed by, for example, the formation of the inner spacer 24. The T-shaped combination of the extrinsic base layer 32a and the base layer 30, which are separately formed, may permit the base resistance to be optimized. The contact 48 connected to the extrinsic base layer 32a is located over the base layer 30.

The opening 22 is patterned in the dielectric layer 20 using a first mask, and the base layer 30 is formed inside the opening 22 with self-alignment to the base layer 30. The extrinsic base layer 32a is separately patterned using a second mask and is not self-aligned to the base layer 30. The disconnect between the patterning leading to the formation of the base layer 30 and the patterning leading to the formation of the extrinsic base layer 32a allows for a high level of configurability in layout, such as an asymmetrical arrangement.

Figure 8:
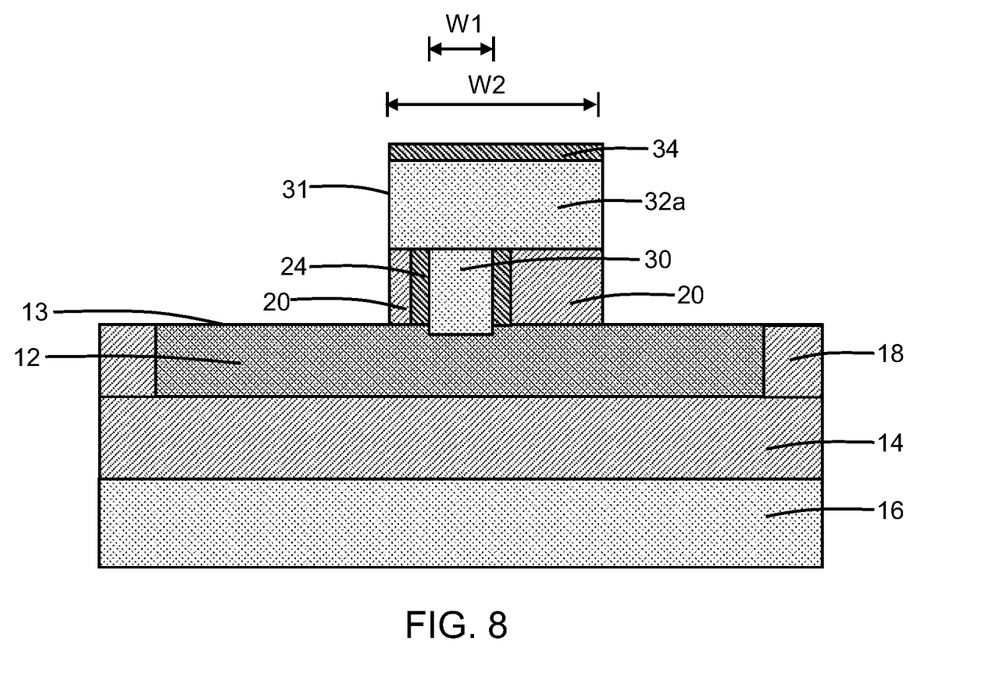
FIGS. 8-9 are cross-sectional views of a structure at successive fabrication stages of a processing method in accordance with alternative embodiments of the invention.

With reference to FIG. 8 and in accordance with alternative embodiments, the extrinsic base layer 32a may be offset laterally relative to the base layer 30. The lateral offset may be established when the cap layer 34 and semiconductor layer 32 are patterned to form the extrinsic base layer 32a. The device layer 12 may be initially doped (e.g., lightly-doped) with an n-type dopant (e.g., arsenic or phosphorus).

Figure 9:
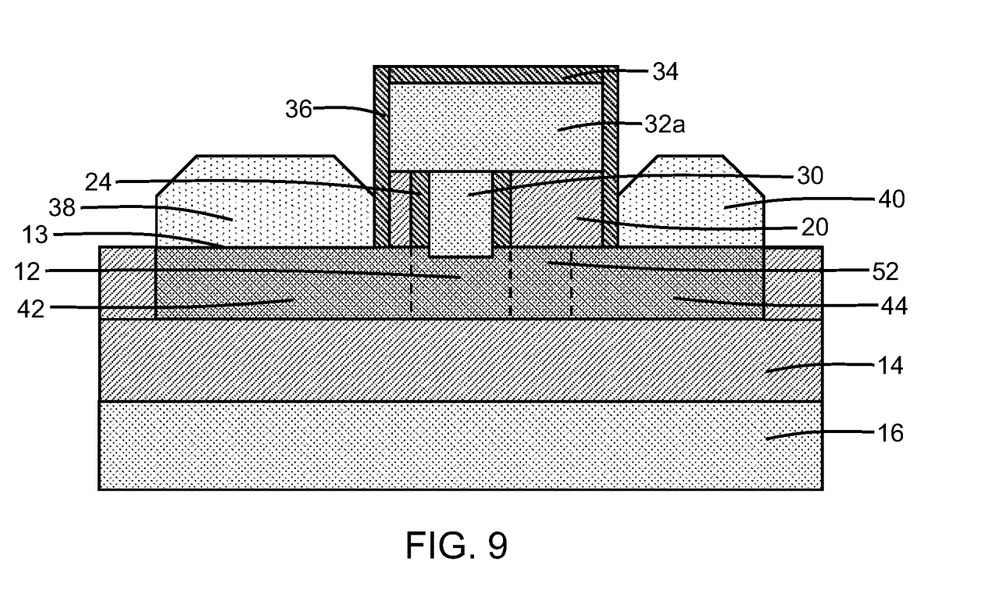

With reference to FIG. 9 in which like reference numerals refer to like features in FIG. 8 and at a subsequent fabrication stage, the outer spacers 36 are formed, and the semiconductor layers 38, 40 are subsequently formed with the semiconductor layer 38 being wider than the semiconductor layer 40 due to the asymmetric placement of the extrinsic base layer 32a. The base layer 30 is positioned in a lateral direction closer to the semiconductor layer 38 than to the semiconductor layer 40.

Dopant of one polarity (e.g., p-type dopant) may be diffused by a rapid thermal anneal from the extrinsic base layer 32a and the base layer 30 into the underlying section of the device layer 12, and dopant of an opposite polarity (e.g., n-type dopant) may be diffused by the rapid thermal anneal from the semiconductor layers 38, 40 into the respective underlying sections of the device layer 12. The asymmetric placement of the extrinsic base layer 32a and differences in the diffusion rate of the dopants of opposite conductivity type produces a lightly-doped collector 52 in a section of the device layer 12 that has the same conductivity type as the doped region 44 but is more lightly doped than the doped region 44. The section of the device layer 12 including the lightly-doped collector 52 is positioned in a lateral direction between section of the device layer 12 including the doped region 44 and the oppositely-doped section of the device layer 12 beneath the base layer 30.

Middle-of-line (MOL) processing and back-end-of-line (BEOL) processing follow.

Figure 10:
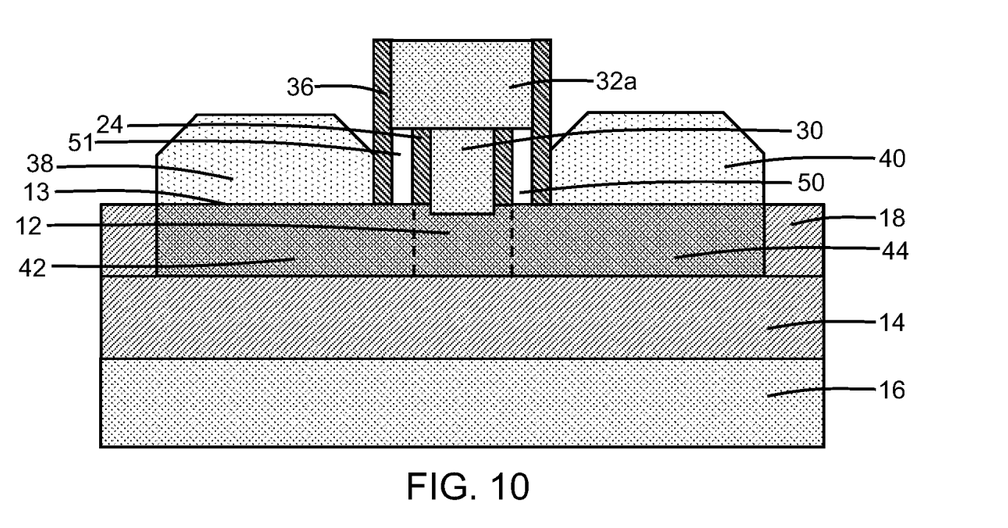
FIG. 10 is a cross-sectional view of a structure in accordance with alternative embodiments of the invention.

With reference to FIG. 10 and in accordance with alternative embodiments, the dielectric layer 20 may be fully removed by the etching process (e.g., the oxide etching process) such that the residual portions of the dielectric layer 20 are not preserved between the device layer 12 and the extrinsic base layer 32a. Instead, cavities 50, 51 are formed adjacent to the inner spacer 24 and in a vertical direction between the extrinsic base layer 32a and the device layer 12. The outer spacers 36 close and seal the cavities 50, 51 to define airgaps. The L-shaped composite spacers now include the outer spacers 36, the sealed cavities 50, 51, and the inner spacer 24. The sealed cavities 50, 51 may have equal or substantially equal sizes, namely equal or substantially equal heights and equal or substantially equal lateral dimensions.

The airgaps provided by the sealed cavities 50, 51 are closed volumes that may be filled by atmospheric air at or near atmospheric pressure, may be filled by another gas at or near atmospheric pressure, or may contain atmospheric air or another gas at a sub-atmospheric pressure (e.g., a partial vacuum). The airgaps provided by the sealed cavities 50, 51 may be characterized by a permittivity or dielectric constant of near unity (i.e., vacuum permittivity), which is less than the dielectric constant of a solid dielectric material.

The airgaps provided by the sealed cavities 50, 51 may be effective to reduce the base-collector capacitance and the base-emitter capacitance, which may lead to an improvement in maximum oscillation frequency (fmax) during device operation.

Figure 11:
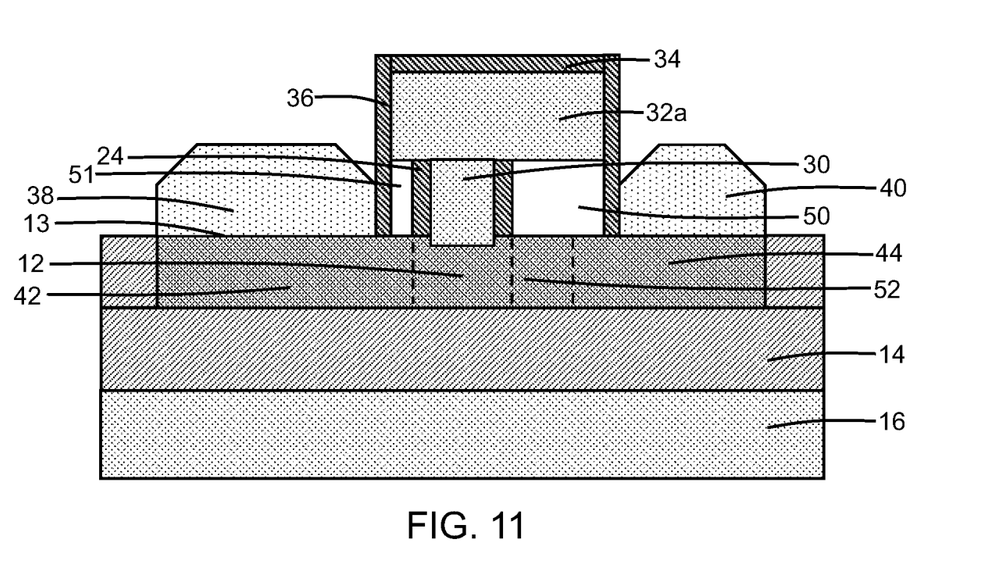
FIG. 11 is a cross-sectional view of a structure in accordance with alternative embodiments of the invention.

With reference to FIG. 11 and in accordance with alternative embodiments, the airgaps provided by the sealed cavities 50, 51 may be formed in the asymmetrical lateral bipolar junction transistor in which the extrinsic base layer 32a is laterally offset relative to the base layer 30. The airgaps provided by the sealed cavities 50, 51 are also asymmetrical with portions of different size, namely the sealed cavity 50 adjacent to the semiconductor layer 40 may be larger (e.g., a larger width) than the sealed cavity 51 adjacent to the semiconductor layer 38.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate+/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a lateral bipolar junction transistor, the structure comprising:
   a semiconductor layer including a recess;
   an emitter including a raised portion on the semiconductor layer;
   a collector including a raised portion on the semiconductor layer; and
   a base including a base layer and an extrinsic base layer stacked with the base layer, the base layer including a portion in the recess in the semiconductor layer, the base layer and the extrinsic base layer positioned in a lateral direction between the raised portion of the emitter and the raised portion of the collector, the base layer having a first width in the lateral direction, the extrinsic base layer having a second width in the lateral direction, and the second width greater than the first width.

2. The structure of claim 1 wherein the extrinsic base layer is centered relative to the base layer.

3. The structure of claim 1 wherein the extrinsic base layer is offset in the lateral direction relative to the base layer.

4. The structure of claim 1 wherein the semiconductor layer includes a first section, a second section, and a third section between the first section and the second section in the lateral direction, the emitter includes the first section of the semiconductor layer and the raised portion of the emitter is positioned on the first section of the semiconductor layer, the collector includes the second section of the semiconductor layer and the raised portion of the collector is positioned on the second section of the semiconductor layer, and the base layer is positioned on the third section of the semiconductor layer.

5. The structure of claim 4 wherein the semiconductor layer includes a fourth section between the second section of the semiconductor layer and the third section of the semiconductor layer in the lateral direction, the third section of the semiconductor layer is doped to have a first conductivity type, the second section and the fourth section of the semiconductor layer are doped to have a second conductivity type, and the fourth section is more lightly doped than the second section of the semiconductor layer.

6. The structure of claim 5 wherein the extrinsic base layer is offset in the lateral direction relative to the base layer.

7. The structure of claim 4 further comprising:
   a handle substrate; and
   a dielectric layer arranged to separate the handle substrate from the semiconductor layer.

8. The structure of claim 1 further comprising:
   a first airgap between the extrinsic base layer and the semiconductor layer; and
   a second airgap between the extrinsic base layer and the semiconductor layer.

9. The structure of claim 8 wherein the base layer is positioned between the first airgap and the second airgap.

10. The structure of claim 8 further comprising:
    a first dielectric spacer between the raised portion of the emitter and the first airgap; and
    a second dielectric spacer between the raised portion of the collector and the second airgap.

11. A structure for a lateral bipolar junction transistor, the structure comprising:
    an emitter including a raised portion;
    a collector including a raised portion;
    a base including a base layer and an extrinsic base layer stacked with the base layer, the base layer and the extrinsic base layer positioned in a lateral direction between the raised portion of the emitter and the raised portion of the collector, the base layer having a first width in the lateral direction, the extrinsic base layer having a second width in the lateral direction, and the second width greater than the first width;

a first airgap positioned in the lateral direction between the base layer and the raised portion of the emitter; and a second airgap positioned in the lateral direction between the base layer and the raised portion of the collector.

12. The structure of claim 11 further comprising:
a first dielectric spacer positioned in the lateral direction between the raised portion of the emitter and the first airgap; and
a second dielectric spacer positioned in the lateral direction between the raised portion of the collector and the second airgap.

13. The structure of claim 11 wherein the first airgap and the second airgap have different sizes.

14. The structure of claim 13 wherein the extrinsic base layer is offset in the lateral direction relative to the base layer.

15. The structure of claim 11 wherein the extrinsic base overlaps with the first airgap and the second airgap.

16. The structure of claim 11 wherein the first airgap and the second airgap have substantially equal sizes.

17. The structure of claim 11 wherein the extrinsic base layer is centered relative to the base layer.

18. The structure of claim 11 further comprising:
a semiconductor layer;
a handle substrate; and
a dielectric layer arranged to separate the handle substrate from the semiconductor layer,
wherein the raised portion of the emitter, the raised portion of the collector, and the base layer are positioned on the semiconductor layer.

19. A method of forming a structure for a lateral bipolar junction transistor, the method comprising:
forming a raised portion of an emitter and a raised portion of a collector; and
forming a base layer of a base, wherein the base layer is positioned in a lateral direction between the raised portion of the emitter and the raised portion of the collector; and
forming an extrinsic base layer of the base that is stacked with the base layer, wherein the extrinsic base layer is positioned in the lateral direction between the raised portion of the emitter and the raised portion of the collector, the base layer has a first width in the lateral direction, the extrinsic base layer has a second width in the lateral direction, and the second width is greater than the first width,
wherein the base layer is formed in a recess defined in a semiconductor layer, and the raised portion of the emitter and the raised portion of the collector are positioned on the semiconductor layer.

20. The method of claim 19 wherein the semiconductor layer is positioned on a dielectric layer, and the dielectric layer is arranged in a vertical direction to separate a handle substrate from the semiconductor layer.

* * * * *